(12) United States Patent
Snoeij

(10) Patent No.: US 11,469,727 B2
(45) Date of Patent: Oct. 11, 2022

(54) PRE-DRIVER STAGE WITH ADJUSTABLE BIASING

(71) Applicant: Texas Instruments Incorporated, Dallas, TX (US)

(72) Inventor: Martijn Fridus Snoeij, Erding (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 114 days.

(21) Appl. No.: 16/916,749

(22) Filed: Jun. 30, 2020

(65) Prior Publication Data

US 2021/0273619 A1    Sep. 2, 2021

Related U.S. Application Data

(60) Provisional application No. 62/982,142, filed on Feb. 27, 2020.

(51) Int. Cl.
*H03F 3/45*    (2006.01)

(52) U.S. Cl.
CPC ..... *H03F 3/45085* (2013.01); *H03F 3/45071* (2013.01); *H03F 2203/45292* (2013.01); *H03F 2203/45344* (2013.01)

(58) Field of Classification Search
CPC ....... H03F 3/45085; H03F 2203/45292; H03F 2203/45344; H03F 2203/45112; H03F 2203/45626; H03F 2203/45674; H03F 3/211; H03F 3/3076; H03F 3/45475; H03F 2203/45612; H03F 1/307; H03F 3/45125; H03F 3/30; H03F 3/3022; H03F 3/45183; H03F 3/45192; H03F 3/45071
USPC .................................................. 330/253, 257
See application file for complete search history.

(56) References Cited

U.S. PATENT DOCUMENTS

| | | | | |
|---|---|---|---|---|
| 6,977,526 B2* | 12/2005 | Li | ........................ | H03F 3/45192 326/83 |
| 7,982,537 B2* | 7/2011 | Hayashi | .............. | H03F 3/45179 330/253 |
| 8,130,034 B2* | 3/2012 | Song | .................... | H03F 3/45192 330/253 |
| 8,188,792 B1* | 5/2012 | Narayan | .................. | G05F 3/262 330/257 |
| 11,082,012 B2* | 8/2021 | Pandey | ............... | H03F 3/45475 |

* cited by examiner

*Primary Examiner* — Khanh V Nguyen
(74) *Attorney, Agent, or Firm* — John R. Pessetto; Charles A. Brill; Frank D. Cimino

(57) ABSTRACT

An electrical system includes a power supply and an electrical circuit coupled to the power supply and including an operational amplifier. The operational amplifier includes an input stage and a pre-driver stage coupled to the input stage, wherein the pre-driver stage includes a first input terminal, a second input terminal, and a voltage supply terminal. The operational amplifier also includes an output stage with bipolar transistors coupled to the pre-driver stage. The pre-driver stage is configured to: detect a voltage differential across the first and second input terminals of the pre-driver stage; and provide an adjustable bias current based on the voltage differential.

22 Claims, 5 Drawing Sheets

PRE-DRIVER STAGE WITH ADJUSTABLE BIASING

CROSS-REFERENCE TO RELATED APPLICATION

This application claim priority to U.S. Provisional Application No. 62/982,142, filed Feb. 27, 2020, titled "A Low-Power BiCMOS Output Pre-Driver Stage with Class-AB Biasing," which is hereby incorporated herein by reference in its entirety.

BACKGROUND

The proliferation of electronic devices and integrated circuit (IC) technology has resulted in the commercialization of IC products. As new electronic devices are developed and IC technology advances, new IC products are commercialized. One example IC product that is needed in electronic devices is an operational amplifier. In one example operational amplifier, bipolar transistors are used in at least one of the stages of the operational amplifier. Example output stage topologies for an operational amplifier include class-A, B, AB, or C topologies, where these topologies vary with regard to the time period that the active element(s) pass current, expressed as a fraction of the period of the input signal waveform. In a class-A amplifier, the active element and related bias circuit conduct through all of the input signal period, which is the most inefficient option. In a class-B amplifier, each of two active elements conducts for only one-half the input signal period, which is more efficient than class-A, but results in crossover distortion when switching conduction between the active elements. In a class-AB amplifier, each of two active elements conducts for more than half of the input signal period, which enables the amount of crossover distortion to be significantly reduced or eliminated. In a class-C amplifier, the active element conducts for much less than half the input period, resulting in high efficiency and distortion.

For a class-AB amplifier, sourcing the bias current for the two active elements is a significant issue that affects the overall quiescent current and power/heat dissipation. With the proliferation of multi-channel electronic systems, power/heat dissipation of IC components such as operational amplifiers is a challenge that continues to present design and cost issues. Efforts to reduce the power/heat dissipation of operational amplifiers with class-AB output stages are ongoing.

SUMMARY

In accordance with at least one example embodiment of the description, an electrical system comprises a power supply and an electrical circuit coupled to the power supply and including an operational amplifier. The operational amplifier includes an input stage and a pre-driver stage coupled to the input stage, wherein the pre-driver stage includes a first input terminal, a second input terminal, and a voltage supply terminal. The operational amplifier also comprises an output stage with bipolar transistors coupled to the pre-driver stage. The pre-driver stage is configured to: detect a voltage differential across the first and second input terminals of the pre-driver stage; and provide an adjustable bias current based on the voltage differential.

In accordance with at least one example embodiment of the description, an operational amplifier comprises an input stage and a pre-driver stage coupled to the input stage. The pre-driver stage includes: a first input terminal; a second input terminal; and a bias current control circuit coupled to the first and second input terminals and configured to provide an adjustable bias current based on a voltage differential across the first and second input terminals. The operational amplifier also includes an output stage with bipolar transistors coupled to the pre-driver stage.

In accordance with at least one example embodiment of the description, a pre-driver circuit comprises first and second input terminals. The pre-driver circuit also comprises a class-AB bias current generator configured to output a control current as a function of a voltage differential across the input terminals. The pre-driver circuit also comprises a current mirror coupled to the class-AB bias current generator, wherein the current mirror is configured to add an adjustable bias current to a fixed bias current of the pre-driver circuit based on the control current.

DETAILED DESCRIPTION

Described herein are pre-driver stage topologies with an adjustable bias current and related circuits and systems. In one example, the pre-driver stage is used to provide base currents for bipolar junction transistors ("BJTs" or just "bipolar" transistors herein) of an operational amplifier's output stage, where the output stage uses class-AB biasing. In the described examples, the described pre-driver stage topologies improve power efficiency over other pre-driver stage topologies by supporting a lower quiescent current. In some examples, the pre-driver stage uses a small fixed bias current to ensure fast response of pre-driver stage components. In addition, the pre-driver stage adds an adjustable bias current to the fixed bias current, where the adjustable bias current increases as a voltage differential across first and second input terminals of the pre-driver stage increases. In one example, the voltage differential represents the difference between an input voltage (VIN) at the first input terminal and a reference voltage (VREF) at the second input terminal. In another example, the voltage differential represents a differential signal (Vina and Vinb) between the first and second input terminals. In either case, the absolute magnitude of the voltage differential across the first and second input terminals can be used to vary the adjustable bias current. With the fixed bias current and the adjustable bias current, the pre-driver stage is able to provide sufficient base current for an output stage while maintaining a low quiescent current. In one example, the pre-driver stage is a bipolar and complementary metal-oxide semiconductor (CMOS) pre-driver stage to provide a high-input impedance. In another example, the pre-driver stage is a bipolar pre-driver stage. In either case, the reduction of the quiescent current as in the described pre-driver stage topologies is important in electrical circuit or systems, where the quiescent current has a significant impact on power consumption or heat dissipation. To provide a better understanding, various pre-driver stage options and related issues are described using the figures as follows.

Figure 1:
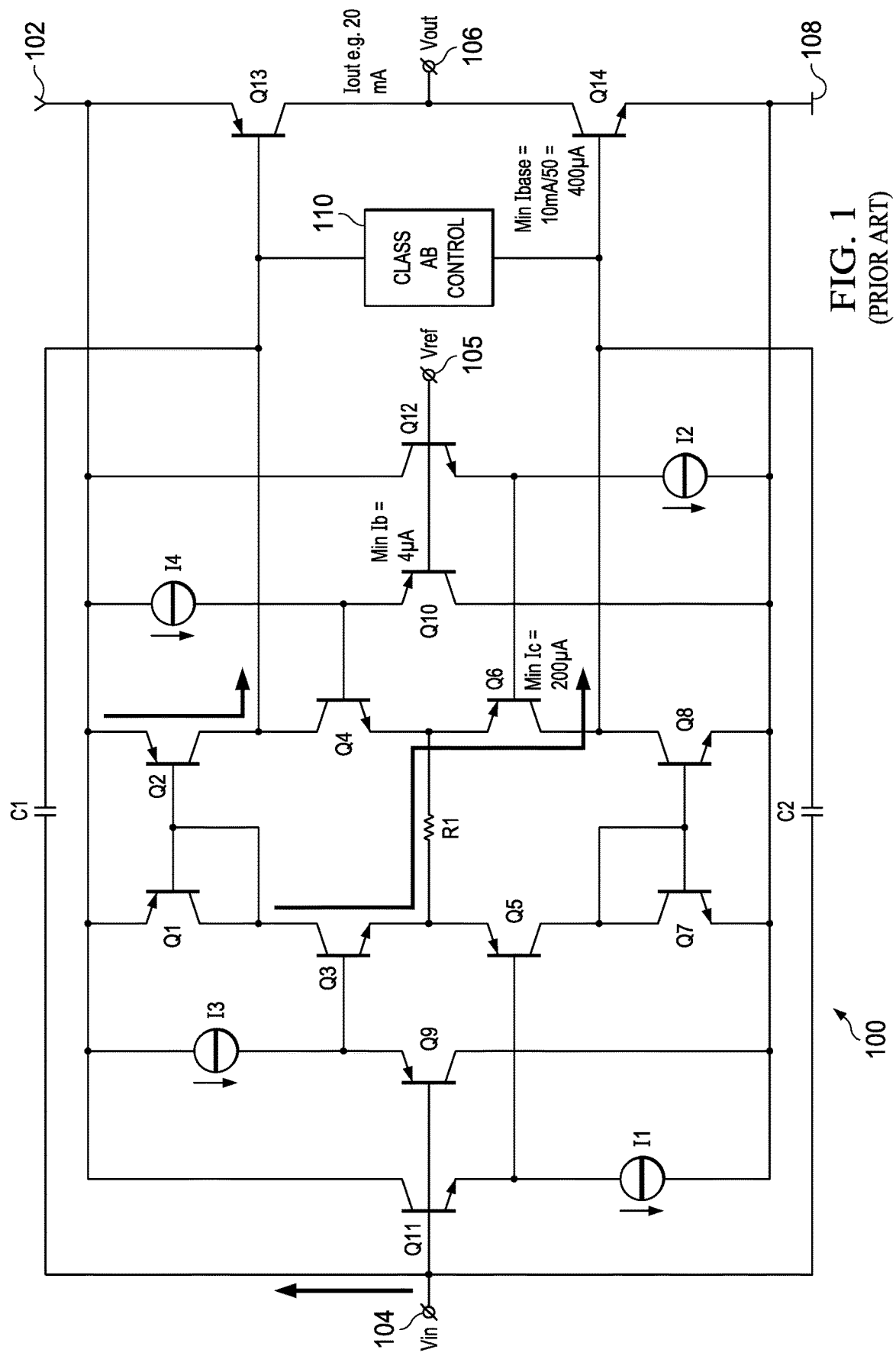
FIG. 1 is a schematic diagram showing operational amplifier circuitry in accordance with conventional technology.

FIG. 1 is a schematic diagram showing operational amplifier circuitry 100 in accordance with an example. The operational amplifier circuitry 100 includes an output stage formed by two transistors (Q13 and Q14) in series between power supply terminal 102 and a ground terminal 108. Between Q13 and Q14 is an output terminal 106. The operational amplifier circuitry 100 also include input voltage (Vin) terminal 104 and a reference voltage (Vref) terminal. When a voltage differential appears across the Vin terminal 104 and the Vref terminal, the operational amplifier circuitry 100 operates to provide an output signal at the output terminal 106 based on the voltage differential. Specifically, operational amplifier circuitry 100 controls the output signal at the output terminal 106 using a pre-driver circuit formed by transistors Q1-Q12, resistor R1, current sources I1-I4, capacitors C1 and C2, and a class-AB control circuit 110.

As represented in FIG. 1, when the voltage level at the Vin terminal 104 increases relative to the voltage level at the Vref terminal 105, current from the power supply terminal flows through Q2 to the base terminal of Q13, increasing the voltage of Q13 and thus reducing its collector current. After some delay, current from the power supply terminal 102 flows through Q1, Q3, and Q6 to the base terminal of Q14, resulting in Q14 increasing collector current, which along with the decreased collector current of Q13 lowers the voltage on output terminal 108. For the pre-driver stage, half of the base current for Q14 is provided directly and another half is provided via a current mirror the class-AB control circuit 110. To ensure proper operation of Q13 and Q14 and provide a target output current of 20 mA, some minimum levels of current are needed. The minimum bias current for I1-I4 is Iout/$\beta^2$, where $\beta$ is transistor current gain. For Iout=20 mA and a minimum $\beta$ of 50 at least 24 uA is needed (4 uA for each of I1-I4, and 4 uA for each of the two central branches). While the gain stage 100 provides good total harmonic distortion and high current drive, a quiescent current of 24 uA for the pre-driver stage represents a significant power consumption.

Figure 2:
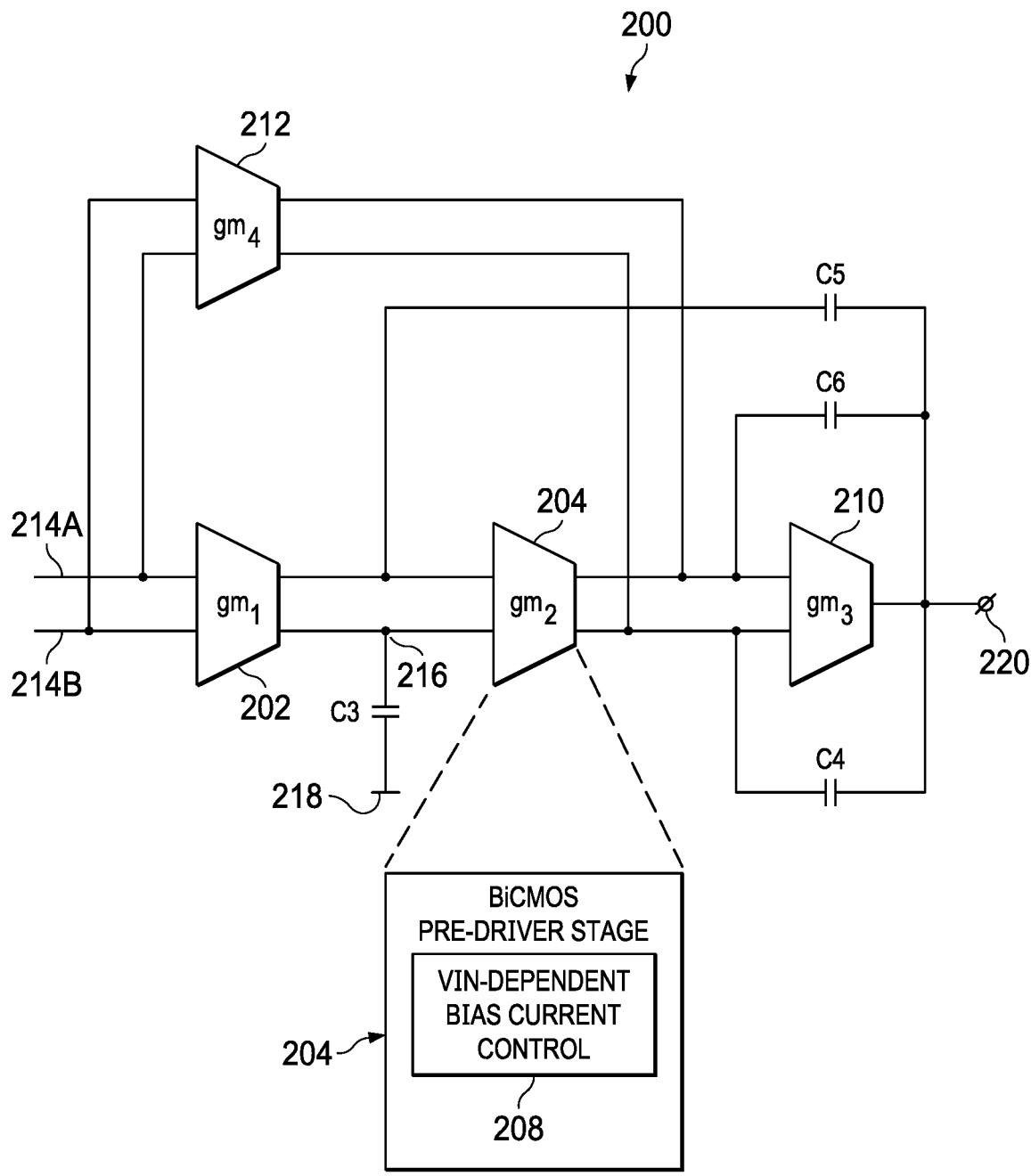
FIG. 2 is a diagram showing an operational amplifier in accordance with an example embodiment.

FIG. 2 is a diagram showing an operational amplifier 200 in accordance with an example embodiment. In FIG. 2, the operational amplifier 200 includes several stages 202, 204, 210, and 212 as shown, where each of the stages 202, 204, and 212 includes a first (upper) input, a second (lower) input, a first (upper) output, and a second (lower) output, and where the stage 210 includes a first (upper) input, a second (lower) input, and a single output.

In the example of FIG. 2, the first stage 202 is an input stage with a first gain ($gm_1$), the second stage 204 is a pre-driver stage with a second gain ($gm_2$), and the third stage 210 is an output stage with a third gain ($gm_3$), where the first stage 202, the second stage 204, and the third stage 210 are in series. In some examples, a fourth stage 212 with a fourth gain ($gm_4$) is part of a feedforward loop between the differential inputs 214A and 214B and the first and second outputs of the second stage 204. As shown, the operational amplifier 200 also includes several capacitors C3-C6. Specifically, C3 is coupled between the second output of the first stage 202 and a ground terminal 216, C4 is coupled between the second input and the output of the third stage 210, C5 is coupled between the first output of the first stage 202 and the output of the third stage 210, and C6 is coupled between the first input of the third stage 210 and the output of the third stage 210. In other examples, the arrangement of the stages and/or other components in an operational amplifier such as the operational amplifier 200 may vary from what is shown in FIG. 2. In one example, the fourth stage 212 is omitted.

In the example of FIG. 2, the second stage 204 is a BiCMOS pre-driver stage with a VIN-dependent bias control circuit 208. In other examples, the second stage 204 is a bipolar pre-driver stage with the VIN-dependent bias control circuit 208. In either case, the quiescent current of the second stage 204 is reduced compared to the pre-driver stage of the operational amplifier circuitry 100 of FIG. 1 while supporting the same Iout levels (e.g., 20 mA). Use of CMOS transistors (e.g., the NMOS transistors M1 and M2 in FIGS. 3 and 4) in the second stage 204 (as in the BiCMOS pre-driver stage example) also has the benefits of a high-input impedance and unlimited base current for some transistors (e.g., Q3 and Q4 in FIGS. 3 and 4). In the bipolar pre-driver example, the input-impedance is not as high as the BiCMOS pre-driver example, but the quiescent current is still lower than the pre-driver stage of the operational amplifier circuitry 100 of FIG. 1.

In some examples, the VIN-dependent bias control circuit 208 uses class-AB biasing, where the transistors M1 and M2 (see FIGS. 3 and 4) are biased by a constant or fixed bias current as well as an adjustable bias current that varies as a function of the absolute magnitude of the differential voltage between the input terminals, or between the input terminal and a reference voltage terminal. With the fixed bias current and the adjustable bias current as described herein, the VIN-dependent bias control circuit 208 is able to provide base currents to drive transistors of the output stage 210.

Figure 3:
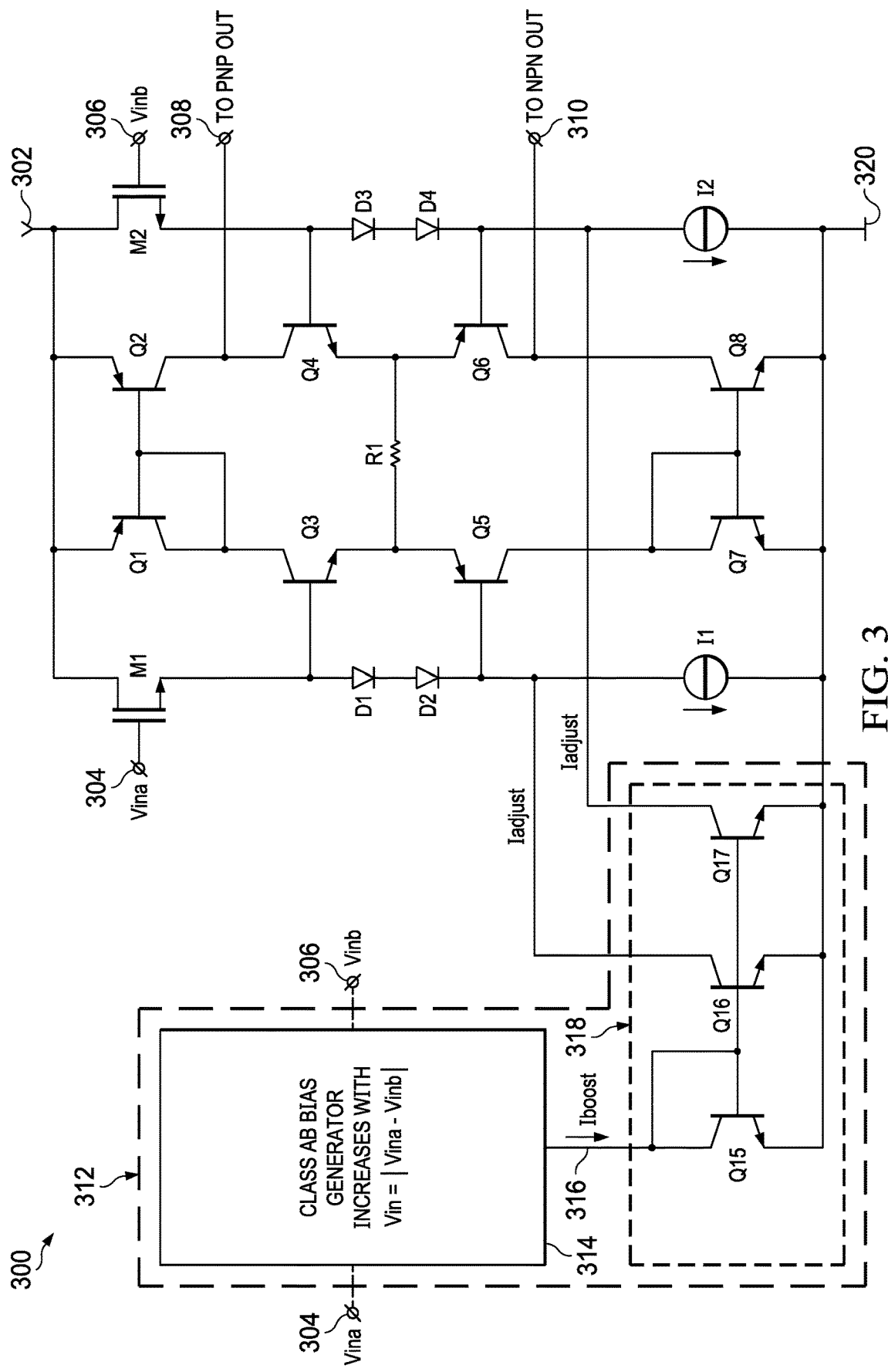
FIG. 3 is a diagram showing a bipolar and complementary metal-oxide semiconductor (BiCMOS) pre-driver stage in accordance with an example embodiment.

FIG. 3 is a diagram showing a BiCMOS pre-driver stage 300 (an example of the second stage 204 in FIG. 2) in accordance with an example embodiment. As shown, the BiCMOS pre-driver stage 300 includes the set of transistors Q1-Q8, a resistor R1, and current sources I1 and I2 having the arrangement described for the pre-driver stage in FIG. 1. More specifically, Q1, Q2, Q5, and Q6 are PNP bipolar transistors, Q3, Q4, Q7, and Q8 are NPN bipolar transistors. As shown, the BiCMOS pre-driver stage 300 includes terminals such as a voltage supply terminal 302, a ground terminal 320, input voltage terminals 304 and 306, and output terminals 308 and 310. While the input terminal 306 is represented in FIG. 3 as an input voltage (e.g., Vinb) terminal, it should be appreciated that the input terminal 306 is a VREF terminal in other examples. In addition, the BiCMOS pre-driver stage 300 includes NMOS transistors M1 and M2, and diodes D1-D4 in the arrangement shown.

In the example of FIG. 3, the BiCMOS pre-driver stage 300 includes a VIN-dependent bias control circuit 312 (an example of the VIN-dependent bias control circuit 208 in FIG. 2) with outputs coupled to the base terminals of Q5 and Q6. As shown, the VIN-dependent bias control circuit 312 includes a class-AB bias generator 314 that outputs a control current (Iboost) 316 that increases as the voltage differential at the input terminals 304 and 306 increases. In some example embodiments, the control current 316 increases as |Vina−Vinb| increases, where Vina is the voltage level at the input terminal 304 and Vinb is the voltage level at the input terminal 306. These input terminals 304 and 306 are also coupled to the class-AB bias generator 314, resulting in a VIN-dependent bias control as described herein. In the example of FIG. 3, the VIN-dependent bias control circuit 312 also includes a current mirror 318 (based on transistors Q15-Q17 in the arrangement shown), where the input to the current mirror 318 is the control current 316. The outputs of the current mirror 318 are provided to the base terminals of Q5 and Q6.

As shown in the example of FIG. 3, the collector terminal of Q5 is coupled to the ground terminal 320 via Q7, where the base terminal of Q7 is coupled to the collector terminals of Q5 and Q7, and where the emitter terminal of Q7 is coupled to the ground terminal. Also, the collector terminal of Q6 is coupled to the ground terminal 320 via Q8, where the base terminal of Q8 is coupled to the base terminal of Q7. Also, the collector terminals of Q6 and Q8 are coupled together, and the emitter terminal of Q8 is coupled to the ground terminal 320. Also, the collector terminals of Q6 and Q8 are coupled together, and the emitter terminal of Q8 is coupled to the ground terminal 320. As shown, the collectors terminals of Q6 and Q8 are also coupled to an NPN out terminal 310, which provides a base current to an NPN bipolar transistor (e.g., Q14 in FIG. 1) of an output stage such as the output stage 210 in FIG. 2.

In the example of FIG. 3, the emitter terminals of Q1 and Q2 are coupled to the voltage supply terminal 302. Also, the base terminals of Q1 and Q2 are coupled together and to the collector terminals of Q1 and Q3. As shown, the collector terminals of Q2 and Q4 are coupled to a PNP out 308, which provides a base current to an PNP bipolar transistor (e.g., Q13 in FIG. 1) of an output stage such as the output stage 210 in FIG. 2.

With the BiCMOS pre-driver stage 300, the quiescent current of a gain stage (e.g., the second stage 204 of FIG. 2) is reduced compared to the gain stage 100 of FIG. 1 while supporting the same Iout levels (e.g., 20 mA). Use of CMOS transistors (e.g., the NMOS transistors M1 and M2 FIG. 3) in the BiCMOS pre-driver stage 300 also the benefits of a high-input impedance and unlimited base current for some transistors Q3 and Q4 in FIG. 3). In some examples, the VIN-dependent bias control circuit 312 uses the class-AB bias generator 314 to provide an adjustable current, where M1 and M2 are biased by a constant or fixed current provided by I1 and I2 as well as the adjustable current from the VIN-dependent bias control circuit 312. Based on the fixed current and the adjustable current, base currents are output to the output terminals 308 and 310 of the BiCMOS pre-driver stage 400 to drive transistors of an output stage (e.g., Q13 and Q14 in FIG. 1). In other example embodiments, M1 and M2 are replaced by NPN bipolar transistors, In this example, the pre-driver stage still provided a fixed bias current and an adjustable bias current as described herein, where the input impedance is reduced compared to the BiCMOS pre-driver stage 300.

Figure 4:
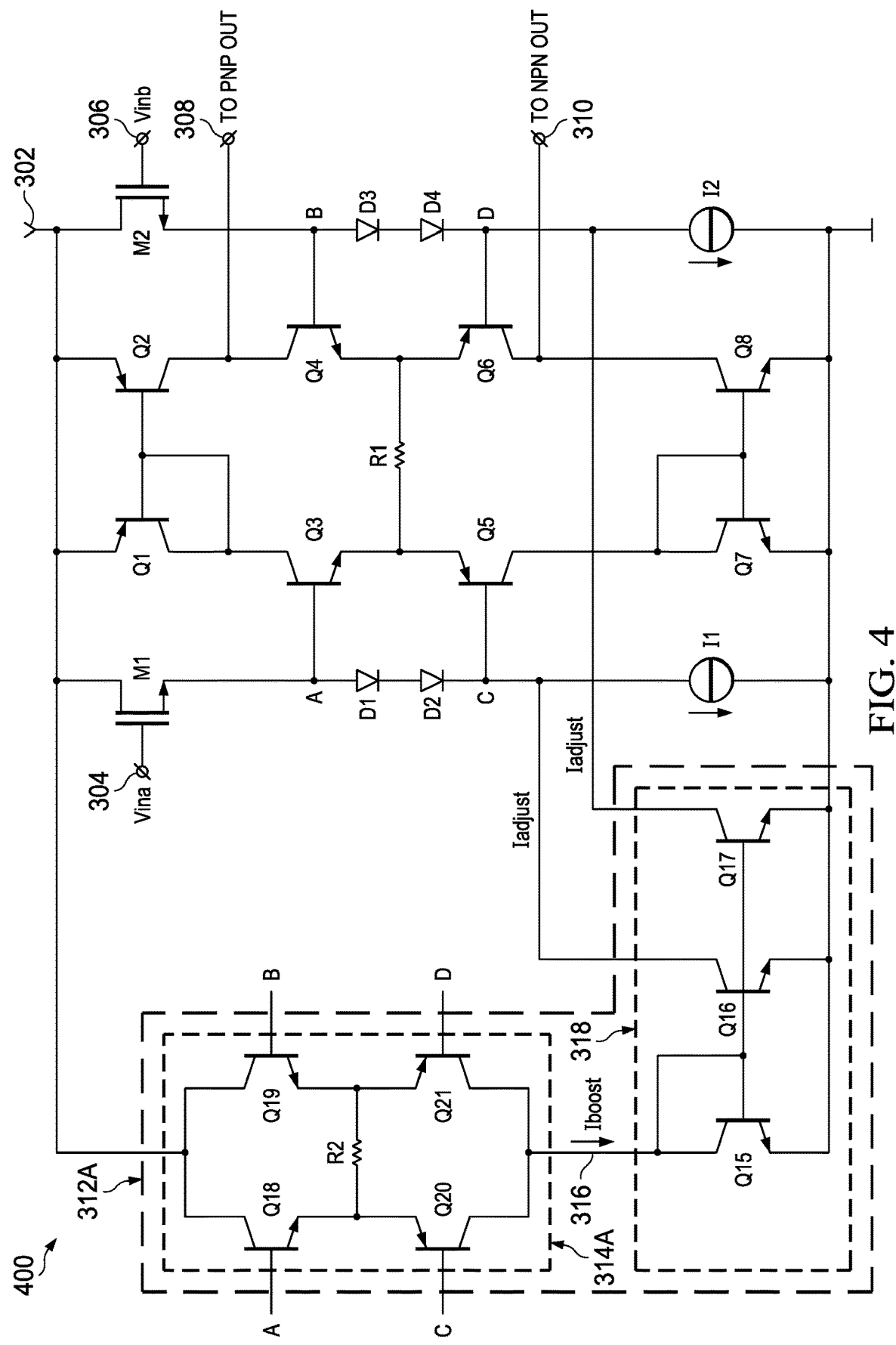
FIG. 4 is a schematic diagram showing a BiCMOS pre-driver stage in accordance with an example embodiment.

FIG. 4 is a schematic diagram showing a BiCMOS pre-driver stage 400 in accordance with an example embodiment. As shown, the BiCMOS pre-driver stage 400 includes the same components described for the BiCMOS pre-driver stage 300 of FIG. 3, where additional details are given for the VIN-dependent bias control circuit 312A in FIG. 4 (an example of the VIN-dependent bias control circuit 312 in FIG. 3). In the example of FIG. 4, the VIN-dependent bias control circuit 312A includes a class-AB bias generator 314A (an example of the class-AB bias generator 314) with transistors Q18-Q21 and resistor R2 in the arrangement shown. In FIG. 4, Q18-21 and R2 of the class-AB bias generator 314A have the have the same topology as Q3-Q6 and R1. As shown, the base terminals of Q3 and Q18 are coupled to the same terminal (labeled A in FIG. 4), the base terminals of Q4 and Q19 are coupled to the same terminal (labeled B in FIG. 4), the base terminals of Q5 and Q20 are coupled to the same terminal (labeled C in FIG. 4), and the base terminals of Q6 and Q21 are coupled to the same terminal (labeled D in FIG. 4).

In FIG. 4, M1 of the BiCMOS pre-driver stage 400 is a first NMOS transistor with a drain terminal coupled to a voltage supply terminal 302, with a gate terminal coupled to the first input terminal 304, and with a source terminal coupled to a base terminal of a first bipolar transistor (e.g., Q3) of the BiCMOS pre-driver stage. Also, M2 of the BiCMOS pre-driver stage 400 is a second NMOS transistor with a drain terminal coupled to the voltage supply terminal 302, with a gate terminal coupled to a VREF or Vinb terminal (e.g., the input terminal 306), and with a source terminal coupled to a base terminal of a second bipolar transistor of the BiCMOS pre-driver stage. In some examples, the BiCMOS pre-driver circuit 400 has a topology portion (e.g., Q3-Q6 and R1) that includes: the first bipolar transistor (e.g., Q3); the second bipolar transistor (e.g., Q4) with a collector terminal coupled to the output stage (at the output terminal 308); a third bipolar transistor (e.g., Q5) with a base terminal coupled to the base terminal of the first bipolar transistor (e.g., Q3) via first and second diodes (e.g., D1 and D2) in series with cathodes facing the base terminal of the third bipolar transistor (e.g., Q5); and a fourth bipolar transistor (e.g., Q6) with a collector terminal coupled to the output stage (at the output terminal 310) and with a base terminal coupled to the base terminal of the second bipolar transistor (e.g., Q4) via third and fourth diodes (e.g., D3 and D4 in FIGS. 3 and 4) in series with cathodes facing the base terminal of the fourth bipolar transistor (e.g., Q6).

As shown in FIGS. 3 and 4, emitter terminals of the first and third bipolar transistors (e.g., Q3 and Q5) are coupled together. Also, emitter terminals of the second and fourth bipolar transistors (e.g., Q4 and Q6) are coupled together. Also, the emitter terminals of the first and third bipolar transistors (e.g., Q3 and Q5) are coupled to the emitter terminals of the second and fourth bipolar transistors (e.g., Q4 and Q6) via a resistor (e.g., R1). Also, the base terminals of the first, second, third, and fourth bipolar transistors (coupled to the A, B, C, and D terminals in FIG. 4) of the BiCMOS pre-driver stage 400 are coupled to the class-AB bias current generator 314A. In some example embodiments, the class-AB bias current generator 312A has a transistor topology (e.g., Q18-Q21 and R2 in FIG. 4) equal to another topology portion (e.g., Q3-Q6 and R1 in FIG. 4) of the BiCMOS pre-driver stage. With the topology of FIG. 4, no separate sensing of Vina or Vinb is needed. Instead, Q8-Q11 of the class-AB bias generator 314A is coupled to terminals A-D as shown. Although this can create positive feedback, the gain of this loop is much less than 1 by making R2>R1.

Figure 5:
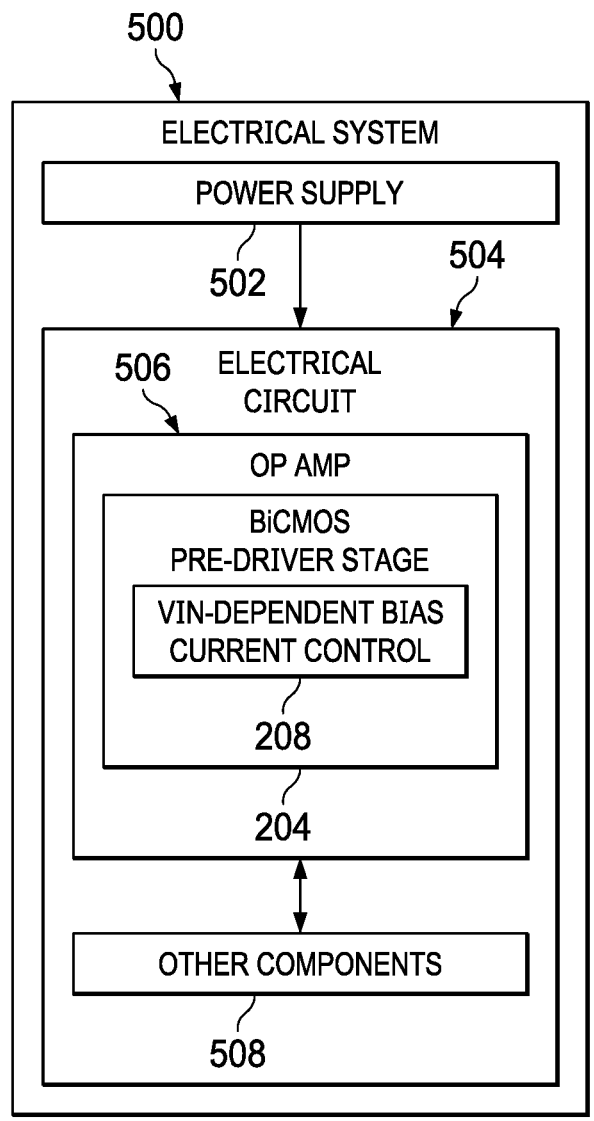
FIG. 5 is a block diagram showing an electrical system in accordance with an example embodiment.

FIG. 5 is a block diagram showing an electrical system 500 in accordance with an example embodiment. As shown, the electrical system 500 includes a power supply 502 (e.g., a battery, switching converter, or other power supply) and an electrical circuit 504 coupled to the power supply 502. The electrical circuit 504 includes an operational amplifier 506 (an example of the operational amplifier 200 in FIG. 2) with the second stage 204. As described herein, the second stage 204 is a BiCMOS pre-driver stage as described herein with the VIN-dependent bias control circuit 208, where the BiCMOS pre-driver stage has the benefits of low quiescent current and high-input impedance (due to M1 and M2). In other examples, the second stage 204 is a bipolar pre-driver stage with the VIN-dependent bias control circuit 208. In either case, the second stage 206 is configured to provide as adjustable bias voltage as described herein. As shown, in FIG. 5, the electrical circuit 504 includes other components 508 (e.g., input-side components or output side components). The lowered power consumption is beneficial in many multi-channel industrial systems, where a large number of operational amplifiers such as the operational amplifier 506 are used at high supply voltage. A reduced power consumption therefore leads to less heat development and simplifies their thermal design.

The term "couple" is used throughout this description. The term may cover connections, communications, or signal paths that enable a functional relationship consistent with this description. For example, if device A generates a signal to control device B to perform an action, in a first example device A is coupled to device B by direct connection, or in a second example device A is coupled to device B through intervening component C if intervening component C does not alter the functional relationship between device A and device B such that device B is controlled by device A via the control signal generated by device A.

Modifications are possible in the described embodiments, and other embodiments are possible, within the scope of the claims.

What is claimed is:

1. An electrical system, comprising:
   a power supply;
   an electrical circuit coupled to the power supply and including an operational amplifier with:
      an input stage;
      a pre-driver stage coupled to the input stage, wherein the pre-driver stage includes a first input terminal, a second input terminal, and a voltage supply terminal; and
      an output stage with bipolar transistors coupled to the pre-driver stage, wherein the pre-driver stage is configured to:
         detect a voltage differential across the first and second input terminals of the pre-driver stage; and
         provide an adjustable bias current based on the voltage differential.

2. The electrical system of claim 1, wherein the pre-driver stage includes a bias current control circuit configured to provide the adjustable bias current based on the voltage differential due to an input voltage (Vina) at the first input terminal of the pre-driver stage and another voltage (Vinb) at the second input terminal of the pre-driver stage, wherein the adjustable bias current is a function of |Vina−Vinb|.

3. The electrical system of claim 2, wherein the bias current control circuit is configured to add the adjustable bias current to a fixed bias current of the pre-driver stage, and wherein the adjustable bias current increases as |Vina−Vinb| increases.

4. The electrical system of claim 3, wherein the bias current control circuit includes:
   a class-AB bias current generator configured to output a control current as a function of Vina and Vinb; and
   a current mirror coupled to the class-AB bias current generator, wherein the current mirror is configured to add the adjustable bias current to the fixed bias current of the pre-driver stage based on the control current.

5. The electrical system of claim 1, wherein the pre-driver stage is a bipolar pre-driver stage that includes:
   a first NPN bipolar transistor with a collector terminal coupled to the voltage supply terminal, with a base terminal coupled to the first input terminal, and with an emitter terminal coupled to a base terminal of a second NPN bipolar transistor of the bipolar pre-driver stage; and
   a third NPN bipolar transistor with a collector terminal coupled to the voltage supply terminal, with a base terminal coupled to the second input terminal, and with an emitter terminal coupled to a base terminal of a fourth NPN bipolar transistor of the bipolar pre-driver stage.

6. The electrical system of claim 1, wherein the pre-driver stage is a bipolar and complementary metal-oxide semiconductor (BiCMOS) pre-driver stage that includes:
   a first n-type metal-oxide semiconductor (NMOS) transistor with a drain terminal coupled to the voltage supply terminal, with a gate terminal coupled to the first input terminal, and with a source terminal coupled to a base terminal of a first bipolar transistor of the BiCMOS pre-driver stage; and
   a second NMOS transistor with a drain terminal coupled to the voltage supply terminal, with a gate terminal coupled to the second input terminal, and with a source terminal coupled to a base terminal of a second bipolar transistor of the BiCMOS pre-driver stage.

7. The electrical system of claim 6, wherein the BiCMOS pre-driver circuit has a topology portion that includes:
   the first bipolar transistor;
   the second bipolar transistor with a collector terminal coupled to the output stage;
   a third bipolar transistor with a base terminal coupled to the base terminal of the first bipolar transistor via first and second diodes in series with cathodes facing the base terminal of the third bipolar transistor; and
   a fourth bipolar transistor with a collector terminal coupled to the output stage and with a base terminal coupled to the base terminal of the second bipolar transistor via third and fourth diodes in series with cathodes facing the base terminal of the fourth bipolar transistor,
   wherein emitter terminals of the first and third bipolar transistors are coupled together,
   wherein emitter terminals of the second and fourth bipolar transistors are coupled together, and
   wherein the emitter terminals of the first and third bipolar transistors are coupled to the emitter terminals of the second and fourth bipolar transistors via a resistor.

8. The electrical system of claim 7, wherein the base terminals of the first, second, third, and fourth bipolar transistors of the BiCMOS pre-driver stage are coupled to the class-AB bias current generator.

9. The electrical system of claim 8, wherein the class-AB bias current generator has a transistor topology equal to the topology portion of the BiCMOS pre-driver stage.

10. An operational amplifier, comprising:
    an input stage; and
    a pre-driver stage coupled to the input stage, wherein the pre-driver stage includes:
       a first input terminal;
       a second input terminal; and
       a bias current control circuit coupled to the first and second input terminals and configured to provide an adjustable bias current based on a voltage differential across the first and second input terminals; and
    an output stage with bipolar transistors coupled to the pre-driver stage.

11. The operational amplifier of claim 10, wherein the bias current control circuit is configured to increase the adjustable bias current in response to an increase in absolute value of the voltage differential across the first and second terminals.

12. The operational amplifier of claim 11, wherein the bias current control circuit is configured to add the adjustable bias current to a fixed bias current of the pre-driver stage.

13. The operational amplifier of claim 10, wherein the pre-driver stage is a bipolar and complementary metal-oxide semiconductor (BiCMOS) pre-driver stage that includes:
a first n-type metal-oxide semiconductor (NMOS) transistor with a drain terminal coupled to a voltage supply terminal of the pre-driver stage, with a gate terminal coupled to the first input terminal, and with a source terminal coupled to a base terminal of a first bipolar transistor of the BiCMOS pre-driver stage; and
a second NMOS transistor with a drain terminal coupled to the voltage supply terminal, with a gate terminal coupled to the second input terminal, and with a source terminal coupled to a base terminal of a second bipolar transistor of the BiCMOS pre-driver stage.

14. The operational amplifier of claim 13, wherein the bias current control circuit includes:
a class-AB bias current generator configured to output a control current as a function of the absolute value of the voltage differential across the input terminals; and
a current mirror coupled to the class-AB bias current generator, wherein the current mirror is configured to add the adjustable bias current to the fixed bias current of the BiCMOS pre-driver stage based on the control current.

15. The operational amplifier of claim 13, wherein the BiCMOS pre-driver stage has a topology portion that includes:
the first bipolar transistor;
the second bipolar transistor with a collector terminal coupled to the output stage;
a third bipolar transistor with a base terminal coupled to the base terminal of the first bipolar transistor via first and second diodes in series with cathodes facing the base terminal of the third bipolar transistor; and
a fourth bipolar transistor with a collector terminal coupled to the output stage and with a base terminal coupled to the base terminal of the second bipolar transistor via third and fourth diodes in series with cathodes facing the base terminal of the fourth bipolar transistor,
wherein emitter terminals of the first and third bipolar transistors are coupled together,
wherein emitter terminals of the second and fourth bipolar transistors are coupled together, and
wherein the emitter terminals of the first and third bipolar transistors are coupled to the emitter terminals of the second and fourth bipolar transistors via a resistor.

16. The operational amplifier of claim 15, wherein the base terminals of the first, second, third, and fourth bipolar transistors of the BiCMOS pre-driver stage are coupled to the class-AB bias current generator.

17. The operational amplifier of claim 16, wherein the class-AB bias current generator has a transistor topology equal to the topology portion of the BiCMOS pre-driver stage.

18. A pre-driver circuit, comprising:
first and second input terminals;
a class-AB bias current generator configured to output a control current as a function of a voltage differential across the input terminals; and
a current mirror coupled to the class-AB bias current generator, wherein the current mirror is configured to add an adjustable bias current to a fixed bias current of the pre-driver circuit based on the control current.

19. The pre-driver circuit of claim 18, wherein the pre-driver circuit is bipolar and complementary metal-oxide semiconductor (BiCMOS) pre-driver circuit that includes:
a first n-type metal-oxide semiconductor (NMOS) transistor with a drain terminal coupled to a voltage supply terminal, with a gate terminal coupled to the first input terminal, and with a source terminal coupled to a base terminal of a first bipolar transistor of the BiCMOS pre-driver stage; and
a second NMOS transistor with a drain terminal coupled to the voltage supply terminal, with a gate terminal coupled to the second input terminal, and with a source terminal coupled to a base terminal of a second bipolar transistor of the BiCMOS pre-driver stage.

20. The pre-driver circuit of claim 19, wherein the BiCMOS pre-driver stage has a topology portion that includes:
the first bipolar transistor;
the second bipolar transistor with a collector terminal coupled to the output stage;
a third bipolar transistor with a base terminal coupled to the base terminal of the first bipolar transistor via first and second diodes in series with cathodes facing the base terminal of the third bipolar transistor; and
a fourth bipolar transistor with a collector terminal coupled to the output stage and with a base terminal coupled to the base terminal of the second bipolar transistor via third and fourth diodes in series with cathodes facing the base terminal of the fourth bipolar transistor,
wherein emitter terminals of the first and third bipolar transistors are coupled together,
wherein emitter terminals of the second and fourth bipolar transistors are coupled together, and
wherein the emitter terminals of the first and third bipolar transistors are coupled to the emitter terminals of the second and fourth bipolar transistors via a resistor.

21. The pre-driver circuit of claim 20, wherein the base terminals of the first, second, third, and fourth bipolar transistors of the BiCMOS pre-driver stage are coupled to the class-AB bias current generator.

22. The pre-driver circuit of claim 21, wherein the class-AB bias current generator has a transistor topology equal to the topology portion of the BiCMOS pre-driver stage.

* * * * *